(12) United States Patent
Ochii et al.

(10) Patent No.: US 7,190,970 B2
(45) Date of Patent: Mar. 13, 2007

(54) MULTIPLEXER

(75) Inventors: Akihiro Ochii, Shiga-ken (JP); Masayuki Shibuya, Taipei (TW); Norio Nakajima, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 319 days.

(21) Appl. No.: 10/718,798

(22) Filed: Nov. 24, 2003

(65) Prior Publication Data
US 2004/0116098 A1  Jun. 17, 2004

(30) Foreign Application Priority Data
Dec. 13, 2002  (JP)  .............................. 2002-362895

(51) Int. Cl.
*H03H 9/72*  (2006.01)
(52) U.S. Cl. ..................... 455/553.1; 455/82; 333/133; 333/193
(58) Field of Classification Search ............. 455/552.1, 455/553.1, 132, 83; 333/133, 134, 132
See application file for complete search history.

(56) References Cited

U.S. PATENT DOCUMENTS

| | | | |
|---|---|---|---|
| 6,175,631 B1 | 1/2001 | Davis et al. | |
| 6,185,434 B1 * | 2/2001 | Hagstrom et al. | 455/552.1 |
| 6,584,304 B1 * | 6/2003 | Thomsen et al. | 455/188.1 |
| 6,628,178 B2 * | 9/2003 | Uchikoba | 333/193 |
| 6,633,748 B1 * | 10/2003 | Watanabe et al. | 455/78 |
| 6,724,278 B1 * | 4/2004 | Smith | 333/133 |
| 2003/0124984 A1 | 7/2003 | Shin et al. | |

FOREIGN PATENT DOCUMENTS

| | | |
|---|---|---|
| JP | 2000-165288 | 6/2000 |
| JP | 2003-115736 | 4/2003 |
| JP | 2003-198309 | 7/2003 |

OTHER PUBLICATIONS

Official Communication dated Dec. 9, 2005, Issued in the corresponding Chinese Patent Application No. 200310122589.4 (with full English translation.).

* cited by examiner

*Primary Examiner*—Edward F. Urban
*Assistant Examiner*—Adeel Haroon
(74) *Attorney, Agent, or Firm*—Keating & Bennett, LLP

(57) ABSTRACT

A small-sized low-cost multiplexer with a low insertion loss includes a first filter defining a lowpass filter that passes a signal in a first frequency band and attenuates a signal in second and third frequency bands, a second filter including a SAW filter and defining a bandpass filter that passes a signal in the second frequency band and attenuates a signal in the first and third frequency bands, and a third filter defining a highpass filter that passes a signal in the third frequency band and attenuates a signal in the first and second frequency bands. One of two ports of each of the first, second, and third filters are connected in common with a common port.

18 Claims, 8 Drawing Sheets

MULTIPLEXER

BACKGROUND OF THE INVENTION

1. Field of the Invention

The present invention relates to a multiplexer for multiplexing or demultiplexing signals in three different frequency bands, and more particularly, to a 1-to-3 multiplexer/demultiplexer integrated in one component.

2. Description of the Related Art

In the field of mobile communication devices, such as a portable telephone, three signals in different frequency bands, such as an AMPS signal, a GPS signal, and a PCS signal, are used by a single communication device.

When signals in three frequency bands are used by a single communication device, if a multiplexer/demultiplexer is used to multiplex or demultiplex three signals in different frequency bands, a circuit at a stage preceding or following the multiplexer/demultiplexer can be used in common for all three frequency bands. This allows for reductions in the size and cost of the communication device.

It is known in the art to use a diplexer to combine or separate two signals in different frequency bands. It is also known in the art to use three signals in different frequency bands by using a diplexer in conjunction with cascaded switches as is taught, for example, by Japanese Unexamined Patent Application Publication No. 2000-165288. An example configuration for the above-described purpose is illustrated in the form of a block diagram in FIG. 7. In the example illustrated in FIG. 7, the above technique is used in the front end of a triple band portable telephone capable of using DCS, PCS, and GSM signals. In transmission operation, as illustrated in FIG. 7, a diplexer 2 connected with an antenna 1 combines transmission signals output from the DCS, PCS, and/or GSM units. During a receiving operation, the diplexer 2 separates a received signal into the DCS, PCS, and/or GSM units. A first RF switch 3 switches the connection of the antenna between transmitters of DCS and PCS units and receivers of DCS and PCS units. A second RF switch 4 switches the connection of the receivers between a receiver Rxd of the DCS unit and a receiver Rxp of the PCS unit. A third RF switch 5 switches the connection of the antenna between a receiver Txg of the GSM unit and a receiver Rxg of the GSM unit. A first filter 6 passes transmission/reception signals of DCS and PCS units. A second filter 7 passes transmission/reception signals of the GSM unit.

In the 1-to-3 multiplexer/demultiplexer illustrated in FIG. 7, transmission/reception signals must pass through the diplexer 2 and two RF switches 3 and 4. This results in an increase in insertion loss compared with the case in which signals pass through only one RF switch in addition to the diplexer 2. Besides, diodes used in RF switches are expensive, and thus the increase in the number of RF switches results in an increase in total cost.

A 1-to-3 multiplexer/demultiplexer can also be realized without using an RF switch, for example, as illustrated in FIG. 8A or 8B. In the example illustrated in FIG. 8A, a first multiplexer/demultiplexer 11 includes a lowpass filter 13 and a highpass filter 14, wherein the lowpass filter 13 passes a signal in a first frequency band and attenuates a signal in second and third frequency bands, and the highpass filter 14 passes a signal in second and third frequency bands and attenuates a signal in the first frequency band. A second multiplexer/demultiplexer 12 includes a lowpass filter 15 and a highpass filter 16, wherein the lowpass filter 15 passes a signal in the second frequency band and attenuates a signal in the third frequency band, and the highpass filter 16 passes a signal in the third frequency band and attenuates a signal in the second frequency band. The first multiplexer/demultiplexer 11 is connected with a common input/output port 17 connected with an antenna. The first multiplexer/demultiplexer 11 is also connected with the second multiplexer/demultiplexer 12 and an input/output port 18 connected with a first-frequency-band signal processing section. The second multiplexer/demultiplexer 12 is also connected with the first multiplexer/demultiplexer 11, an input/output port 19 connected with a second-frequency-band signal processing section, and an input/output port 20 connected with a third-frequency-band signal processing section.

In the example illustrated in FIG. 8B, a first multiplexer/demultiplexer 11 includes a lowpass filter 13 and a highpass filter 14, wherein the lowpass filter 13 passes signals in a first frequency band and a second frequency band and attenuates a signal in third frequency bands, and the highpass filter 14 passes a signal in the third frequency band and attenuates signals in the first and second frequency bands. A second multiplexer/demultiplexer 12 includes a lowpass filter 15 and a highpass filter 16, wherein the lowpass filter 15 passes a signal in the first frequency band and attenuates a signal in the second frequency band, and the highpass filter 16 passes a signal in the second frequency band and attenuates a signal in the first frequency band. The first multiplexer/demultiplexer 11 is connected with a common input/output port 17 connected with an antenna. The first multiplexer/demultiplexer 11 is also connected with the second multiplexer/demultiplexer 12 and an input/output port 20 connected with a third-frequency-band signal processing section. The second multiplexer/demultiplexer 12 is connected with the first multiplexer/demultiplexer 11, an input/output port 18, and an input/output port 19, wherein the input/output port 18 is also connected with a first frequency band signal processing section, and the input/output port 19 is also connected with the third-frequency-band signal processing section.

In both examples illustrated in FIGS. 8A and 8B, each 1-to-3 multiplexer/demultiplexer includes two 1-to-2 multiplexer/demultiplexers that are connected with each other. As a result, the signal in the second frequency band has to pass through two filters, and thus the signal encounters a large insertion loss. Further, the use of two multiplexer/demultiplexers increases the number of components and the size of the component.

SUMMARY OF THE INVENTION

In order to overcome the problems described above, preferred embodiments of the present invention provide a small-sized low-cost multiplexer.

According to a preferred embodiment of the present invention, a multiplexer includes a first filter that passes a signal in the first frequency band and attenuates a signal in the second and third frequency bands, a second filter that passes a signal in the second frequency band and attenuates a signal in the first and third frequency bands, and a third filter that passes a signal in the third frequency band and attenuates a signal in the first and second frequency bands. The first filter is a lowpass filter, the second filter is a bandpass filter, and the third filter is a highpass filter. One of two input/output ports of each of the first, second, and third filters is connected together with a common port.

In the multiplexer according to a preferred embodiment of the present invention in which one of two ports of each of the first, second, and third filters is connected together with the common port, any signal in the first, second, and third frequency bands passes through only one of those three filters. Thus, a reduction in insertion loss is achieved. Further, a small number of components is needed, and reductions in size and cost are achieved.

In the multiplexer according to the preferred embodiment of the present invention, at least one of elements of the first and third filters may be disposed on the mounting surface of a multilayer substrate, each layer of which is preferably made of ceramic. The remaining elements of the first and third filters may be disposed on an at least one interior layer of the multilayer substrate. The second filter may include a SAW filter disposed on the mounting surface of the multilayer substrate. Use of the bandpass filter formed of the SAW filter instead of a bandpass filter disposed on at least one interior layer of the multilayer substrate makes it possible to achieve low insertion loss within the passband and high attenuation outside the passband.

In the multiplexer according to preferred embodiments of the present invention, all elements of the first and third filters may be disposed on at least one interior layer of a multilayer substrate, each layer of which is preferably made of ceramic. The second filter may include a SAW filter disposed on the mounting surface of the multilayer substrate. Use of the bandpass filter including the SAW filter makes it possible to achieve low insertion loss within the passband and high attenuation outside the passband.

In the multiplexer according to preferred embodiments of the present invention, a frequency band used in a system dedicated to receiving a signal may be selected as the second frequency band. In this case, no high-level signal, which may destroy the SAW filter, is input to the SAW filter.

In the multiplexer according to preferred embodiments of the present invention, the first filter may include an inductor connected in series with the common port. The inductor defines a portion of the lowpass filter and prevents signals in the second or third frequency band higher than the passband of the first filter from passing into the first filter. This suppresses the loss of the signals in the second and third frequency bands.

In the multiplexer according to preferred embodiments of the present invention, each of the highpass filter and the lowpass filter may have an attenuation pole. The passband of the highpass filter may be a 1900 MHz band, the passband of the bandpass filter may be a 1500 MHz band, and the passband of the lowpass filter may be a 800 MHz band. The frequency of the attenuation pole of the highpass filter may be close to the passband of the bandpass filter, and the frequency of the attenuation pole of the lowpass filter may be between the passband of the bandpass filter and the passband of the highpass filter.

Use of the highpass filter having an attenuation pole that is located close to the passband of the bandpass filter allows the highpass filter to effectively attenuate a signal in the second frequency band. Further, use of the lowpass filter having an attenuation pole that is located between the passband of the bandpass filter and the passband of the highpass filter allows the lowpass filter to have a good attenuation characteristic at frequencies higher than the passband of the bandpass filter and at frequencies in the passband of the highpass filter.

In the multiplexer according to preferred embodiments of the present invention, the multilayer substrate may have a substantially rectangular shape. The signal input/output terminals may be disposed on respective sides of the mounting surface of the multilayer substrate, and a ground terminal may be disposed between each two adjacent signal input/output terminals. This results in an improvement in isolation between each two adjacent signal input/output terminals and also results in a reduction in insertion loss in the three frequency bands.

In this multiplexer according to preferred embodiments of the present invention, the remaining elements disposed on at least one interior layer of the multilayer substrate may be disposed in interior layers other than a layer immediately below the layer disposed with lands for connections with input/output terminals of the SAW filter. This arrangement results in an improvement in isolation between the second frequency band and the first/third frequency band and also results in a reduction in insertion loss in the three frequency bands.

In the multiplexer according to preferred embodiments of the present invention, a coil may be disposed on an interior layer of the multilayer substrate, and, when any other element is disposed on a layer immediately adjacent to a layer in which the coil is disposed, the element is disposed at a location that is not close to the coil. This arrangement allows the coil to have a high Q factor, and thus the filter using this coil has a low insertion loss.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1A:
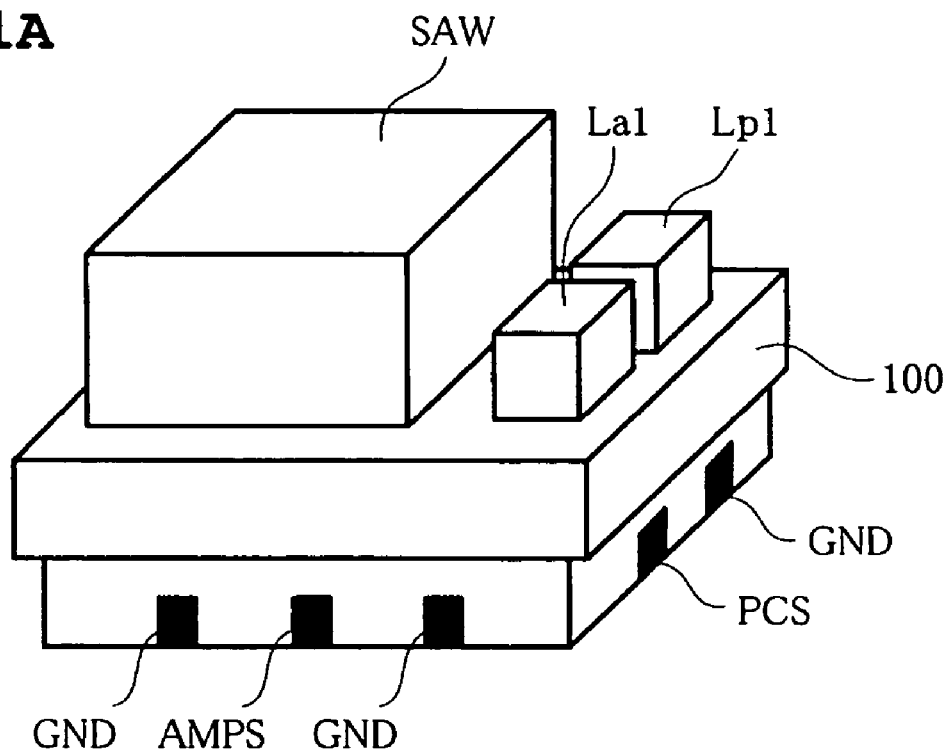
FIG. 1A is a perspective view showing the external appearance of a multiplexer according to a preferred embodiment of the present invention.
Figure 1B:
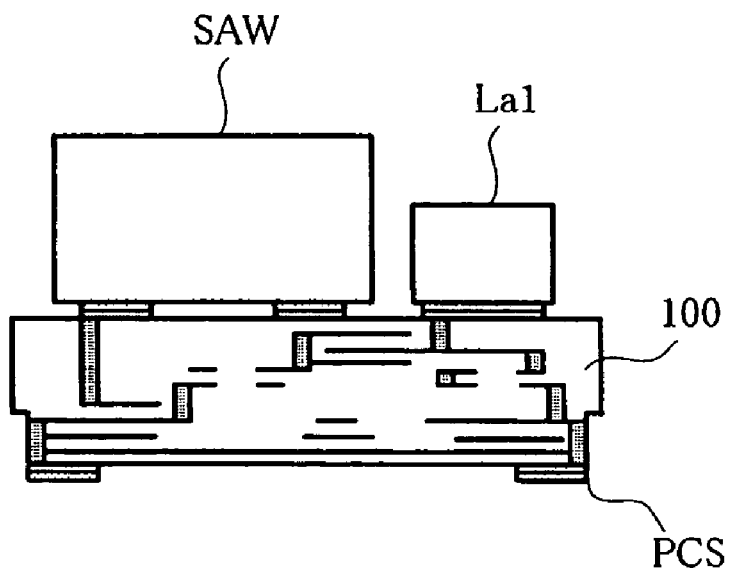
FIG. 1B is a cross-sectional view of a multiplexer according to a preferred embodiment of the present invention.

FIG. 1A is a perspective view illustrating the external appearance of a multiplexer according to a preferred embodiment of the present invention, and FIG. 1B is a cross-sectional view thereof. A multiplexer substrate 100, including a plurality of ceramic sheets laminated together, forms parts of the first, the second, and the third filters. SAW filter and chip coils La1 and Lp2 are disposed on the upper surface of the multilayer substrate 100. A ground terminal GND and a plurality of signal input/output terminals are disposed on the lower surface of the multilayer substrate 100 such that each terminal extends from the bottom lower surface to a side surface.

As illustrated in FIG. 1, the multilayer substrate 100 preferably has a substantially rectangular shape. Signal input/output terminals are disposed on each side of a mounting surface (the lower surface in FIG. 1) of the multilayer substrate 100, and one ground terminal GND is disposed between each of two adjacent signal input/output terminals.

Figure 2:
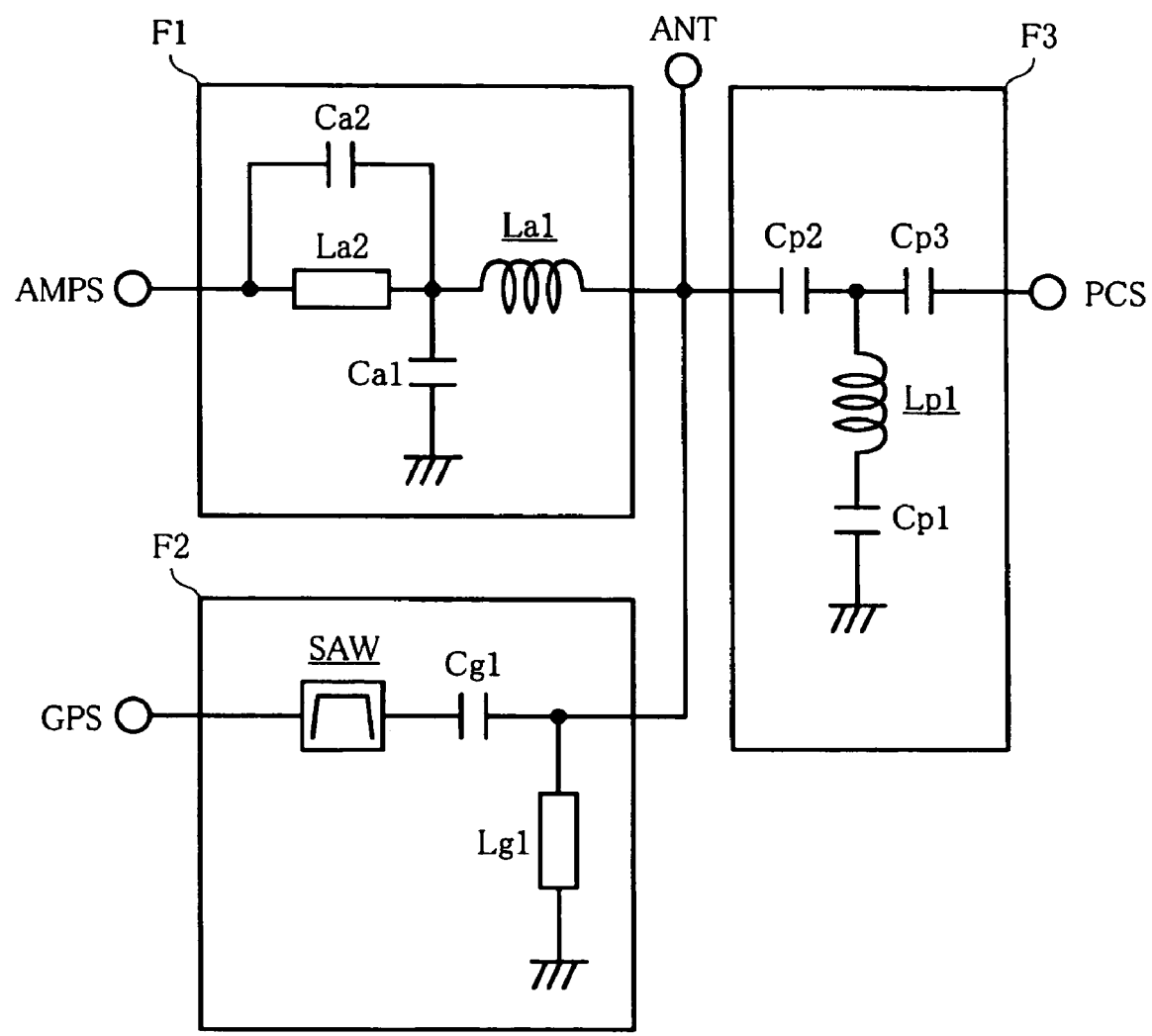
FIG. 2 is a circuit diagram of the multiplexer according to a preferred embodiment of the present invention.

FIG. 2 is a circuit diagram illustrating an equivalent circuit of the multiplexer. A first filter F1 is disposed between an antenna port ANT and an AMPS-signal input/output port AMPS. A second filter F2 is disposed between the antenna port ANT and a GPS-signal input (output) port GPS. A third filter F3 is disposed between the antenna port ANT and a PCS-signal input/output port PCS. The other one of two input/output ports of each of the first, second, and third filters is connected in common to the antenna port ANT. Herein, the AMPS (Advanced Mobile Phone System) is a system in which a signal in a 800 MHz band (859 {±} 35 MHz) is used, the GPS (Global Positioning System) is a system in which a signal in a 1500 MHz band (1575.42 {±} 1.025 MHz) is used, and the PCS (Personal Communication Service) is a system in which a signal in a 1900 MHz band (1920 {±} 70 MHz) is used. In the AMPS and the PCS, communication is performed between a base station and a mobile station. In contrast, in the GPS, only receiving of a signal from a GPS satellite is allowed.

The first filter F1 operates as a lowpass filter that passes a signal in the 800 MHz band used in the AMPS. The second filter F2 operates as a bandpass filter that passes a signal in the 1500 MHz band used in the BPS. The third filter F3 operates as a highpass filter that passes a signal in the 1900 MHz band used in the PCS.

The first filter F1 includes inductors La1 and La2 and capacitors Ca1 and Ca2. A chip coil disposed on the upper surface of the multilayer substrate 100 illustrated in FIG. 1 is used as the inductor La1. The inductor La2 is formed by an inductor electrode (coil pattern) disposed on an interior layer of the multilayer substrate 100. The capacitors Ca1 and Ca2 are defined by capacitor electrodes disposed on interior layers of the multilayer substrate 100.

The second filter F2 includes a SAW filter, a capacitor Cg1, and an inductor Lg1. The SAW filter SAW is disposed on the upper surface of the multilayer substrate 100 as illustrated in FIG. 1. The capacitor Cg1 is defined by a capacitor electrode disposed on an interior layer of the multilayer substrate 100. The inductor Lg1 is defined by an inductor electrode (coil) disposed on interior layer of the multilayer substrate 100. By not forming an LC filter in the inside of the multilayer substrate but by using the SAW filter, a low insertion loss within the passbands and high attenuation outside the passbands can be achieved.

The third filter F3 includes capacitors Cp1, Cp2, and Cp3 and an inductor Lp1. The inductor Lp1 is defined by a chip coil disposed on the upper surface of the multilayer substrate 100 as illustrated in FIG. 1. The capacitors Cp1, Cp2, and Cp3 are formed by disposing capacitor electrodes on the interior layers of the multilayer substrate 100.

In the first filter F1, as illustrated in FIG. 2, the inductor La1 is disposed on the side of the common port (ANT) that defines a portion of the lowpass filter and prevents signals in the second or third frequency band that are higher than the passband of the first filter F1 from passing into the first filter. This suppresses the loss of the signals in the second and third frequency bands.

Figure 3A:
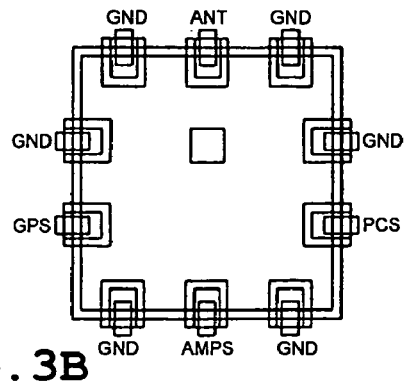
FIGS. 3A to 3H are diagrams illustrating electrode patterns and conductor patterns disposed in various layers of the multiplexer according to a preferred embodiment of the present invention.
Figure 3B:
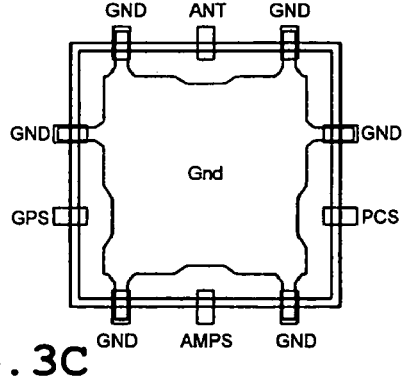
Figure 3C:
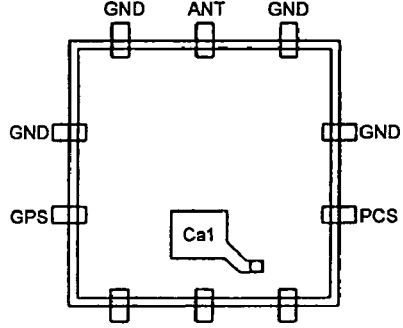
Figure 3D:
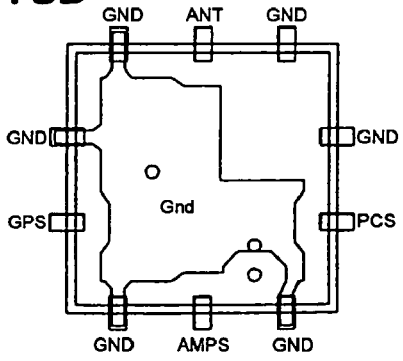
Figure 3E:
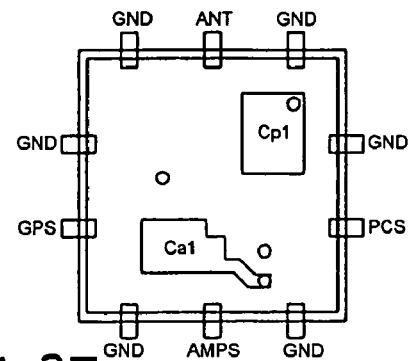
Figure 3F:
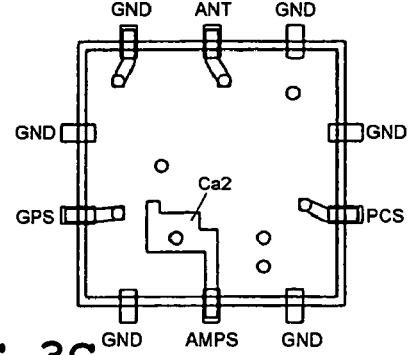

Specific examples of electrode patterns disposed on respective dielectric layers of the multilayer substrate 100 are illustrated in FIGS. 3A to 3H, 4A to 4G, and 5A to 5D. FIG. 3A illustrates the bottom dielectric layer. The dielectric layer illustrated in FIG. 3B is disposed on the dielectric layer illustrated in FIG. 3A, and the dielectric layer illustrated in FIG. 3C is disposed thereon. Similarly, dielectric layers illustrated in FIGS. 3D to 3H are disposed one on another and furthermore dielectric layers illustrated in FIGS. 4A to 4G and dielectric layers illustrated in FIGS. 5A to 5C are disposed one on another. FIG. 5D shows the multilayer substrate obtained by disposing the above-described dielectric layers one on another and, finally, mounting the SAW filter SAW and the chip coils La1 and Lp1 on the upper surface of the multilayer substrate.

As illustrated in FIGS. 3A to 3H, an input/output terminal AMPS for a AMPS signal, an input/output terminal GPS for a GPS signal, an input/output terminal PCS for a PCS signal, an antenna terminal ANT, and ground terminals GND are disposed on side surfaces of the multilayer substrate 100 such that each terminal extends from a side surface to the bottom surface of the multilayer substrate 100. As illustrated in FIGS. 3A to 3H, one ground terminal GND is disposed between each of two adjacent signal input/output terminals. On the dielectric layer illustrated in FIG. 3B and on the dielectric layer illustrated in FIG. 3D, there is disposed a ground electrode Gnd connected with particular ground terminals GND. On the dielectric layer illustrated in FIG. 3C, a capacitor electrode Ca1 of the capacitor Ca1 is disposed. On the dielectric layer illustrated in FIG. 3E, capacitor electrodes Ca1 and Cp1 of the respective capacitors Ca1 and Cp1 are disposed. On the dielectric layer illustrated in FIG. 3F, a capacitor electrode Ca2 of the capacitor Ca2 is disposed. On the dielectric layer illustrated in FIG. 3H, coils La2 and Lg1 defining a portion of the respective inductors La2 and Lg1 are disposed.

Figure 4A:
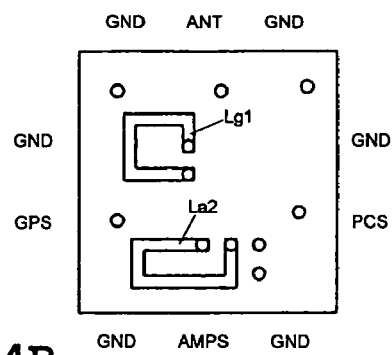
FIGS. 4A to 4G are diagrams illustrating electrode patterns and conductor patterns disposed in various layers of the multiplexer according to a preferred embodiment of the present invention.
Figure 4B:
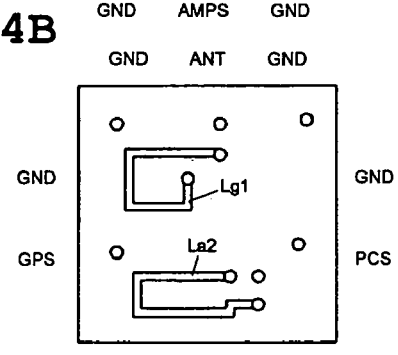
Figure 4C:
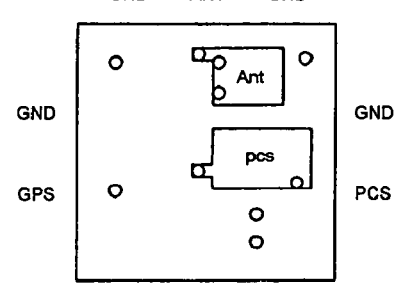
Figure 4D:
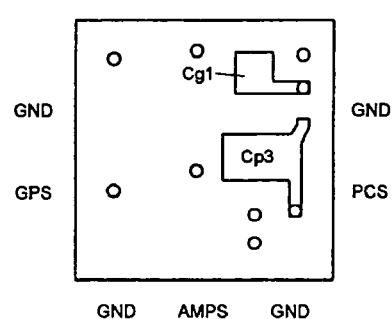
Figure 4E:
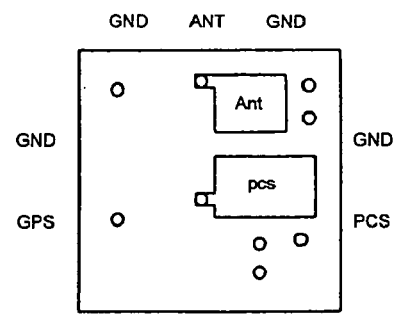
Figure 4F:
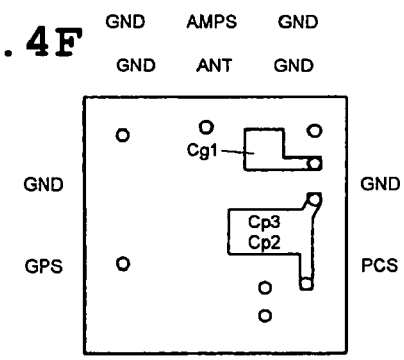
Figure 4G:
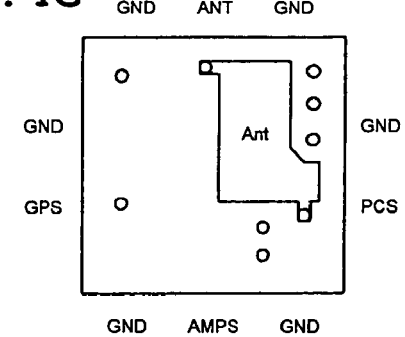
Figure 5A:
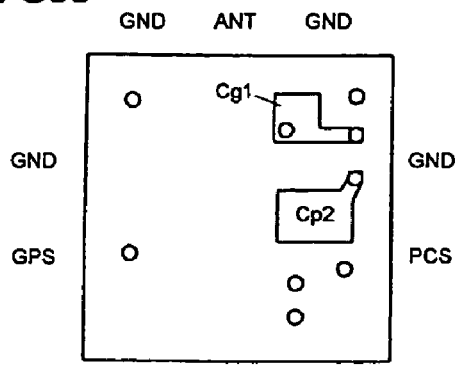
FIGS. 5A to 5D are diagrams illustrating electrode patterns and conductor patterns disposed in various layers of the multiplexer.
Figure 5B:
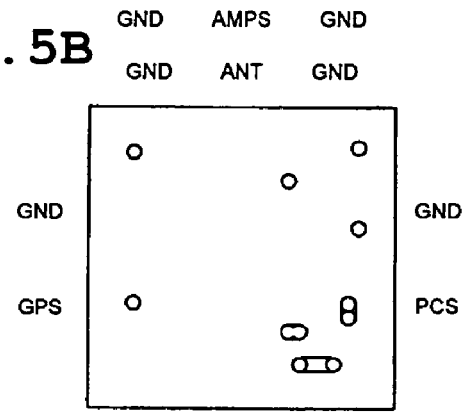
Figure 5C:
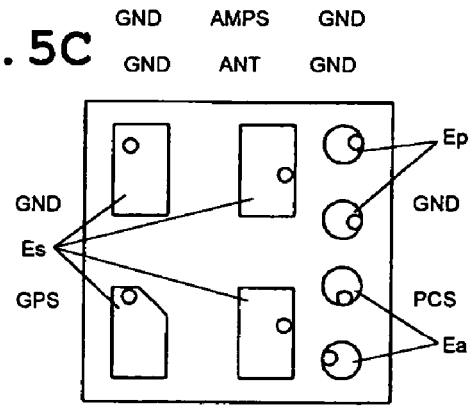
Figure 5D:
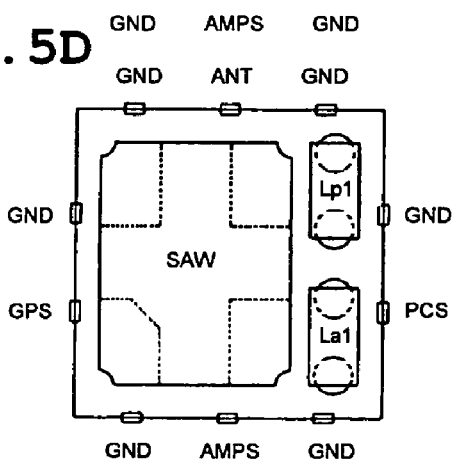

On the dielectric layers illustrated in FIGS. 4A and 4B, coils La2 and Lg1 defining the other portion of the respective inductors La2 and Lg1 are disposed. The coils Ls2 and Lg2 on those dielectric layers are connected with corresponding parts disposed on the dielectric layer illustrated in FIG. 3H. On each of the dielectric layers illustrated in FIGS. 4C and 4E, a capacitor electrode pcs of the capacitor Cp3 connected to the input/output terminal PCS for the PCS signal and a capacitor electrode Ant of the capacitor Cg1 connected to the antenna terminal ANT are disposed. On each of the dielectric layers illustrated in FIGS. 4D and 4F, capacitor electrodes Cg1 and Cp3 of the respective capacitors Cg1 and Cp3 are disposed. On the dielectric layer illustrated in FIG. 4F, a capacitor electrode Cp2 of the capacitor Cp2 is disposed. On the dielectric layer illustrated in FIG. 4G, a capacitor electrode Ant, which is used in common by the capacitors Cp2, Cp3, and Cg1 and is connected with the antenna input/output terminal ANT, is disposed.

On the dielectric layer illustrated in FIG. 5A, capacitor electrodes Cp2 and Cg1 of the respective capacitors Cp2 and Cg1 are disposed. On the dielectric layer illustrated in FIG. 5C, lands Es for connection with the input/output terminals of the SAW filter are disposed and lands Ea and Ep on which to mount the inductors La1 and Lp1, respectively, are also disposed. As illustrated in FIG. 5D, the SAW filter SAW is surface-mounted on the land Es, and the chip coils La1 and Lp1 are surface-mounted on the lands Ea and Ep, respectively.

As illustrated in FIGS. 3A to 5D, signal input/output terminals are disposed on respective sides of the mounting surface of the multilayer substrate having a substantially rectangular shape, and one ground terminal GND is disposed between each two adjacent signal input/output terminals. This results in an improvement in isolation between each two adjacent signal input/output terminals and also results in a reduction in insertion loss in the three frequency bands.

As can be seen from FIGS. 5B and 5C, no electrodes are disposed on the layer immediately below the layer on which the lands Es for connection with the input/output terminals of the SAW filter are disposed, but capacitor electrodes and conductor patterns for coils are disposed on the other layers. This results in an improvement in isolation between a signal in the second frequency band passing through the SAW filter and signals in the first and third frequency bands passing through the first and third filters and also results in a reduction in insertion loss in the three frequency bands.

Figure 3G:
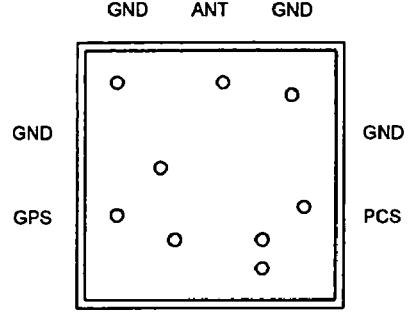
Figure 3H:
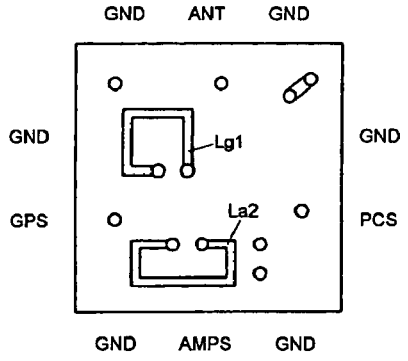

On the layers, such as the dielectric layer illustrated in FIG. 3G, immediately adjacent to the dielectric layer (illustrated in FIG. 3H) on which coil patterns are disposed, elements other than the coils are disposed at locations not close to the coils. In the specific example illustrated in FIG. 3G, no electrode patterns or conductor patterns other than via holes are disposed. This allows the coils to have a high Q factor, and thus the first and second filters using those coils have a low insertion loss.

Figure 6:
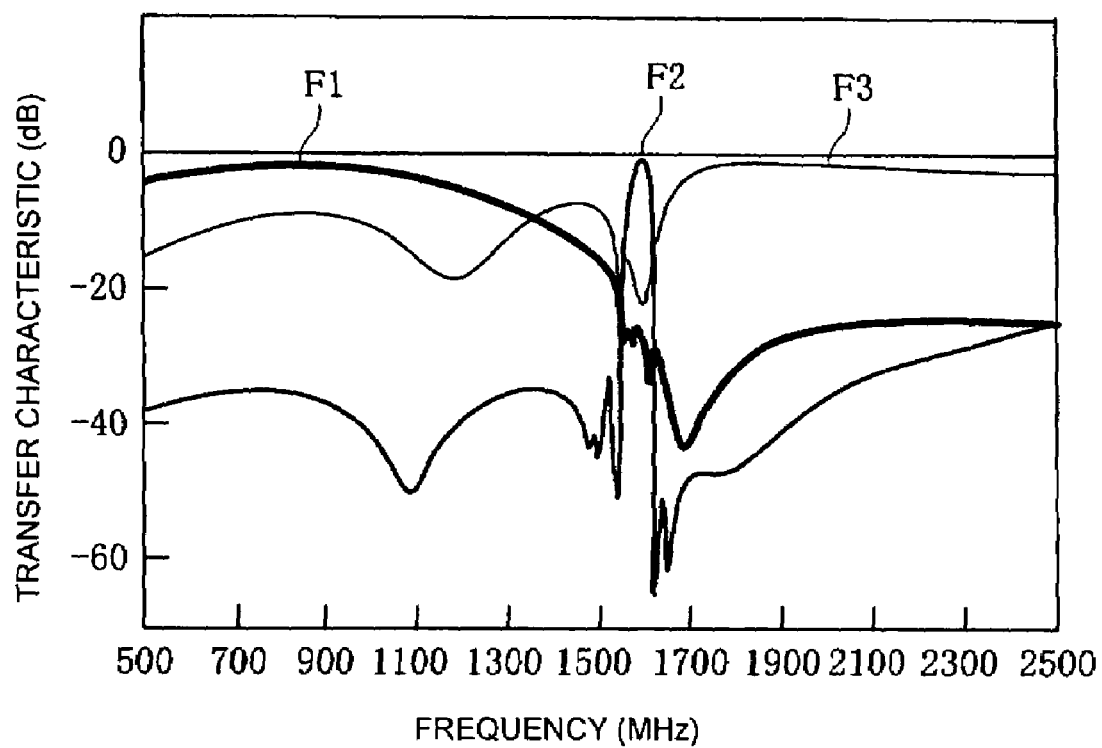
FIG. 6 is a diagram illustrating the transfer characteristics of the first, the second, and the third filters.
Figure 7:
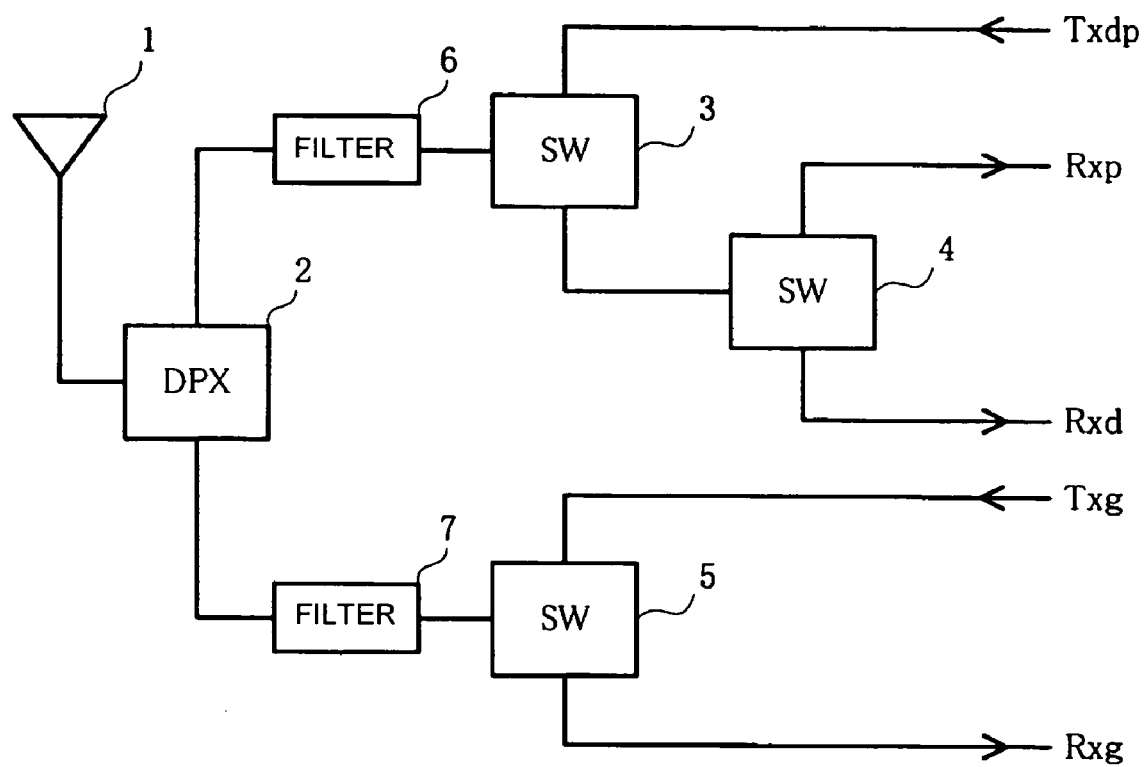
FIG. 7 is a block diagram illustrating a conventional multiplexer.
Figure 8A:
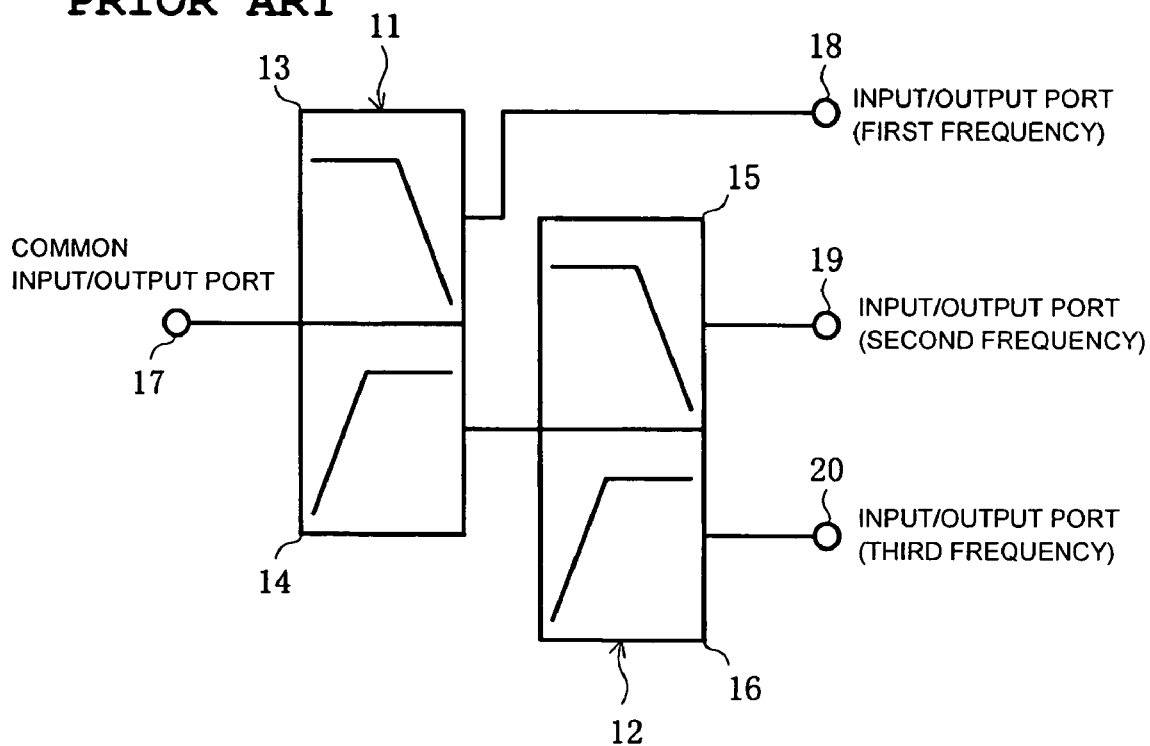
FIGS. 8A and 8B are block diagrams illustrating a conventional multiplexer.
Figure 8B:
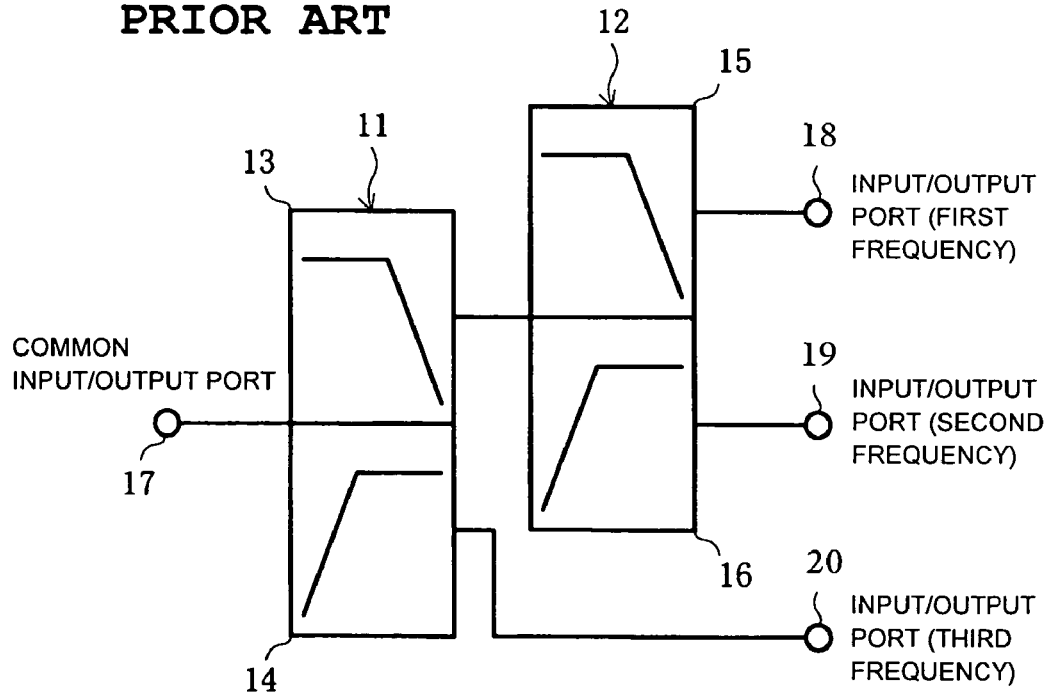

FIG. 6 shows the transfer characteristic of the multiplexer including the dielectric layers illustrated in FIGS. 3A to 5D. In FIG. 6, a curve F1 shows the transfer characteristic of the first filter F1, a curve F2 shows the transfer characteristic of the second filter F2, and a curve F3 shows the transfer characteristic of the third filter F3. As can be seen from FIG. 6, the first filter F1 is a lowpass filter having a passband that is a 800-MHz band and which has an attenuation pole close to 1700 MHz. The third filter F3 is a highpass filter having a passband that is a 1900-MHz band and which has an attenuation pole close to 1600 MHz. The second filter F2 has a passband with a predetermined bandwidth centered at 1575 MHz and has attenuation poles close to upper and lower band edges. By forming the attenuation pole of the highpass filter at a location close to the passband of the bandpass filter as described above, it becomes possible for the highpass filter to effectively attenuate a signal in the second frequency band. Further, by forming the attenuation pole of the lowpass filter between the passband of the bandpass filter and the passband of the highpass filter, it becomes possible for the lowpass filter to have good attenuation characteristics at frequencies higher than the passband of the bandpass filter and at frequencies in the passband of the highpass filter.

In preferred embodiments of the present invention described above, one of elements of the first filter and one of elements of the third filter are mounted on the upper surface of the multilayer substrate on which the SAW filter of the second filter is also mounted. Alternatively, all elements of the first and third filters may be disposed on an interior layer of the multilayer substrate, and only the SAW filter of the second filter may be mounted on the upper surface of the multilayer substrate. Also in this configuration, low insertion loss within the passbands and high attenuation outside the passbands are achieved.

As can be understood from the above description, the present invention provides great advantages. That is, in the multiplexer according to the preferred embodiments of the present invention, one of two ports of each of the first, second and third filters is connected together with the common port. Thus, any signal in the first, second, and third frequency band passes through only one of those three filters. This allows a reduction in insertion loss. Thus, a small number of components and reductions in size and cost can be achieved.

According to the preferred embodiments of the present invention, at least one of elements of the first and third filters is disposed on the multilayer substrate, each layer of which is preferably made of ceramic. The remaining elements of the first and third filters are disposed on interior layers of the multilayer substrate, and the second filter includes the SAW filter disposed on the multilayer substrate. This makes it possible to achieve a low insertion loss within the passbands and high attenuation outside the passbands compared with the case in which the bandpass filter is formed using an LC circuit on interior layers of the multilayer substrate.

Also according to the preferred embodiments of the present invention, all elements of the first and third filters are disposed on the interior of the multilayer substrate, and the SAW filter of the second filter is disposed on the multilayer substrate. Also in this configuration, a low insertion loss within the passbands and high attenuation outside the passbands are achieved.

Also according to the preferred embodiments of the present invention, a frequency band used in a system dedicated to receiving a signal is preferably selected as the second frequency band. In this case, no high-level signal, which may destroy the SAW filter, is input to the SAW filter.

According to the preferred embodiments of the present invention, the first filter includes an inductor connected in series with the common port. The inductor defines a portion of the lowpass filter and prevents signals in the second or third frequency band higher than the passband of the first filter from passing into the first filter. This suppresses the loss of the signals in the second and third frequency bands.

According to the preferred embodiments of the present invention, each of the highpass filter and the lowpass filter has an attenuation pole. The 1900 MHz band is selected as the passband of the highpass filter, the 1500 MHz band is selected as the passband of the bandpass filter, and the 800 MHz band is selected as the passband of the lowpass filter. The attenuation pole of the highpass filter is formed at a location close to the passband of the bandpass filter, whereby it becomes possible for the highpass filter to effectively attenuate a signal in the second frequency band. Further, use of the lowpass filter having an attenuation pole that is located between the passband of the bandpass filter and the passband of the highpass filter allows the lowpass filter to have a good attenuation characteristic at frequencies higher than the passband of the bandpass filter and at frequencies in the passband of the highpass filter.

According to the preferred embodiments of the present invention, the multilayer substrate preferably has a substantially rectangular. The signal input/output terminals are disposed on respective sides of a mounting surface of the multilayer substrate, and one ground terminal is disposed between each two adjacent signal input/output terminals. This arrangement results in an improvement in isolation between each of two adjacent signal input/output terminals and also results in a reduction in insertion loss in the three frequency bands.

According to the preferred embodiments of the present invention, the elements of the multilayer substrate are disposed in layers other than the layer immediately below the layer on which lands for connections with the input/output terminals of the SAW filter are disposed. This results in an improvement in isolation between the second frequency band and the first/third frequency band and also results in a reduction in insertion loss in the three frequency bands.

According to the preferred embodiments of the present invention, a coil is disposed in the inside of the multilayer substrate, and, when any of the other elements are disposed in a layer immediately adjacent to a layer in which the coil is disposed, the other element is disposed at a location not close to the coil. This allows the coil to have a high Q factor, and thus the filter using this coil has a low insertion loss.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A multiplexer comprising:
    a first filter that passes a signal in a first frequency band and attenuates a signal in a second and a third frequency bands;
    a second filter that passes a signal in the second frequency band and attenuates a signal in the first and third frequency bands;
    a third filter that passes a signal in the third frequency band and attenuates a signal in the first and second frequency bands; and
    a multilayer substrate; wherein
    the first filter is a lowpass filter, the second filter is a bandpass filter, the third filter is a highpass filter, and one of two input/output ports of each of the first, second and third filters is connected together with a common port;
    at least one element of the first and third filters is disposed on a mounting surface of the multilayer substrate;
    the remaining elements of the first and third filters are disposed on at least one interior layer of the multilayer substrate; and
    the second filter includes a SAW filter disposed on the mounting surface of the multilayer substrate.

2. A multiplexer according to claim 1, wherein the multilayer substrate includes a plurality of ceramic layers.

3. A multiplexer according to claim 1, wherein the multilayer substrate is substantially rectangular.

4. A multiplexer according to claim 1, wherein signal input/output terminals are disposed on respective sides of the mounting surface of the multilayer substrate; and
    a ground terminal is disposed between each two adjacent signal input/output terminals.

5. A multiplexer according to claim 1, wherein the remaining elements disposed on at least one interior layer of the multilayer substrate are disposed on at least one interior layer other than an interior layer immediately below a layer provided with lands for connections with input/output terminals of the SAW filter.

6. A multiplexer according to claim 1, wherein a coil is disposed on an interior layer of the multilayer substrate; and
    if any other element of the multiplexer is disposed on an interior layer immediately adjacent to the interior layer on which the coil is disposed, and the other element of the multiplexer is disposed at a location not close to the coil.

7. A multiplexer according to claim 1 wherein the second frequency band is a frequency band used in a system dedicated to receiving a signal.

8. A multiplexer according to claim 1 wherein the first filter includes an inductor connected in series with the common port.

9. A multiplexer according to claim 1 wherein each of the first filter and the third filter has an attenuation pole, the passband of the third filter is a 1900 MHz band, the passband of the second filter is a 1500 MHz band, the passband of the first filter is a 800 MHz band, the frequency of the attenuation pole of the third filter is close to the passband of the second filter, and the frequency of the attenuation pole of the first filter is between the passband of the second filter and the passband of the third filter.

10. A multiplexer comprising:
    a first filter that passes a signal in a first frequency band and attenuates a signal in a second and a third frequency bands;
    a second filter that passes a signal in the second frequency band and attenuates a signal in the first and third frequency bands;
    a third filter that passes a signal in the third frequency band and attenuates a signal in the first and second frequency bands; and
    a multilayer substrate; wherein
    the first filter is a lowpass filter, the second filter is a bandpass filter, the third filter is a highpass filter, and one of two input/output ports of each of the first, second and third filters is connected together with a common port;
    all elements of the first and third filters are disposed on at least one interior layer of the multilayer substrate; and
    the second filter includes a SAW filter disposed on a mounting surface of the multilayer substrate.

11. A multiplexer according to claim 10, wherein the multilayer substrate includes a plurality of ceramic layers.

12. A multiplexer according to claim 10, wherein the multilayer substrate is substantially rectangular.

13. A multiplexer according to claim 10, wherein signal input/output terminals are disposed on respective sides of the mounting surface of the multilayer substrate; and
    a ground terminal is disposed between each two adjacent signal input/output terminals.

14. A multiplexer according to claim 10, wherein the remaining elements disposed on at least one interior layer of the multilayer substrate are disposed on at least one interior layer other than an interior layer immediately below a layer provided with lands for connections with input/output terminals of the SAW filter.

15. A multiplexer according to claim 10, wherein a coil is disposed on an interior layer of the multilayer substrate; and
    if any other element of the multiplexer is disposed on an interior layer immediately adjacent to the interior layer on which the coil is disposed, and the other element of the multiplexer is disposed at a location not close to the coil.

16. A multiplexer according to claim 10, wherein the second frequency band is a frequency band used in a system dedicated to receiving a signal.

17. A multiplexer according to claim 10, wherein the first filter includes an inductor connected in series with the common port.

18. A multiplexer according to claim 10, wherein each of the first filter and the third filter has an attenuation pole, the passband of the third filter is a 1900 MHz band, the passband of the second filter is a 1500 MHz band, the passband of the first filter is a 800 MHz band, the frequency of the attenuation pole of the third filter is close to the passband of the second filter, and the frequency of the attenuation pole of the first filter is between the passband of the second filter and the passband of the third filter.

* * * * *